United States Patent [19]

Aisslinger

[11] Patent Number: 5,077,556
[45] Date of Patent: Dec. 31, 1991

[54] CANOPY FOR SCREENING OBJECTS

[75] Inventor: Dieter Aisslinger, Geisenheim, Fed. Rep. of Germany

[73] Assignee: Synteen Gewebe Technik GmbH, Klettgau-Erzingen, Fed. Rep. of Germany

[21] Appl. No.: 428,306

[22] Filed: Oct. 30, 1989

[30] Foreign Application Priority Data

Nov. 2, 1988 [DE] Fed. Rep. of Germany ... 8813680[U]

[51] Int. Cl.$^5$ ............................................. H01Q 17/00
[52] U.S. Cl. ............................................. 342/3; 342/4
[58] Field of Search ................................ 342/3, 4, 1, 2

[56] References Cited

U.S. PATENT DOCUMENTS

| H308 | 7/1987 | Tutin et al. | 342/4 |
|---|---|---|---|
| 3,300,781 | 1/1967 | Clough et al. | 342/3 |
| 3,315,260 | 4/1967 | Wesch | 342/3 |
| 3,427,619 | 2/1969 | Wesch et al. | 342/3 |
| 4,001,827 | 1/1977 | Wallin et al. | 342/3 |
| 4,034,375 | 7/1977 | Wallin | 342/3 |
| 4,287,243 | 9/1981 | Nielsen | 342/3 X |
| 4,473,826 | 9/1984 | Pusch et al. | 342/5 |
| 4,725,490 | 2/1988 | Goldberg | 342/1 X |
| 4,728,554 | 3/1988 | Goldberg et al. | 342/1 X |

Primary Examiner—John B. Sotomayor
Attorney, Agent, or Firm—Walter C. Farley

[57] ABSTRACT

A canopy screening an object, especially its thermally emitted waves and/or against hf electromagnetic waves in the microwave range, especially radar waves, has external textile sheets (1, 2) connected by a support fabric (13), i.e., a spacer, which forms a center space (10). At least one external surface, i.e. its filaments are provided with a coating (6, 7) which in part or in whole is reflecting in the thermal range and/or absorbing in the microwave range.

20 Claims, 2 Drawing Sheets

CANOPY FOR SCREENING OBJECTS

This invention relates to a canopy or cover for screening an object, in particular to reduce its emitted, thermal radiation and/or to reduce reflected high-frequency (hf) electromagnetic waves in the microwave range, especially radar waves.

BACKGROUND OF THE INVENTION

Especially for military applications, there is a large need to protect objects from being detected through thermal imaging and/or radar. In this respect essentially two physical and engineering problems must be solved.

On one hand the protection of the object requires screening its radiation, for instance thermal emission, and on the other hand, the hf electromagnetic radiation directed at the object should be absorbed.

Known solutions for these purposes include glass mats and shaped, bulky plastic structures with electrically conductive additives, as well as mats with felt textures to dampen and also to absorb radiation in the electromagnetic spectrum. Moreover attempts have been carried out to achieve suitable screens using two-dimensionally packed glass-, steel- and rock-wool. These screens are bulky and awkward and susceptible to environmental meteorological factors, for instance rain. Logistic difficulties follow from the bulk in transport and in handling.

It is further known to deposit and introduce suspensions or slurries of metal fibrils on and into coated and uncoated fabrics. The initial effect so achieved, that is the formation of a defined electrical surface resistance, however varies with time, i.e., during the life of this device, and accordingly renders its application unreliable and questionable.

Moreover screening means are known which essentially consist of a textile, three-ply design sewn at the edge. The two outer layers are each fitted with a colored, metallic reflective coat in order to minimize the emission and maximize the reflection.

The central ply serves as a spacer to assure the proper thickness of the enclosed insulating layer of air in the unfolded state. If in the particular application this embodiment is placed over a convex or edged, warm, emitting object, then this insulating air gap is substantially eliminated so that, in spite of the cover, there still is heat conduction from the inside to the outside. Another drawback of this design is the susceptibility of the metallic reflective layers to corrosion and the recognizable, specifically reflecting signals in the radar range. The overall system effectiveness depends on how much corrosion affects the metallic layer and to what extent this layer already has been degraded by crack formation. Cracks are formed most of all when folding and unfolding this screening means. In order to artificially imitate foliage and to create a spatial effect optically, these screens are provided with cuts. As a result, when in use, parts of the screen lift off the original plane on account of twisting and elongation. Disadvantageously, the thermal radiation passes through the gaps and the contours of the object to be masked, even if attenuated, are revealed.

An attempt has been made to circumvent this drawback by means of a two-ply netting design, with coated, areal and overlapping textiles being staggered on both nettings. This step does improve the screening efficacy, however against the tradeoff of complex handling and high professional demands on the operating personnel.

SUMMARY OF THE INVENTION

An object of the present invention is to provide a canopy of the above kind that shall be a universal and easily handled accessory and of which the effectiveness shall be retained over a substantial time.

This problem may be solved in that external textile surfaces are connected to each other through a support fabric or spacer forming a center space and in that at least one external textile surface or its filaments shall be coated in part or in whole with a layer that reflects in the thermal range and/or absorbs in the microwave range. One or both textile external surface(s) may be grid-shaped to enhance convective heat adaptation.

Briefly described, the invention comprises a canopy to obscure an object by confining its thermally emitted waves and absorbing high-frequency (hf) electromagnetic waves in the microwave range, especially radar waves, comprising first and second external textile sheets, means for interconnecting said sheets to each other including a support fabric forming and maintaining a central space between said sheets, and a coating on at least one external surface of said sheets which reflects incident energy in the thermal range and absorbs incident electromagnetic energy in the microwave range.

The layer or coating of the invention illustratively can be a synthetic resin pigmented with carbon black or fibers. Moreover magnetic powders or pigments can be mixed into this layer and/or this layer can be enriched with magnetic, spherical iron oxide granules.

Thereby an impermeable screen is formed on the external textile surface that will absorb hf electromagnetic radiation over a wide frequency band. Simultaneously this double-surface screen also insulates the object to be protected against heat radiation over a specific range.

The synthetic resin offers the further advantage of being weather-resistant and water-repellant. Also, this coating is incombustible.

Preferably, the above coating can be colored with appropriate masking, camouflage colors or be provided with a colored non-emitting film. Thereby the conventional optical appearance is attained.

In a preferred embodiment of the invention, electrically conducting filaments such as wires, corresponding yarns, monofilaments and/or foil tapes are connected to the external textile surface as warps or fillings in the manner of textiles manufacture. These filaments also serve to absorb hf electromagnetic waves. For that purpose these electrically conducting filaments may consist of a substrate foil with deposited metal film and/or of an electrically conducting coating. For the sake of simplicity, these filaments are cut out of a suitably coated base sheet, this base sheet also being coated on both sides where called for.

In another preferred embodiment, the filaments are connected only in part to the external sheets or surfaces and form the support fabric between the two corresponding external textile surfaces. Thereby the two external surfaces are connected to each other by the support fabric or the like, i.e., by flexible spacer means in the manner of the textile industry.

An advantage of this design is that it allows moreover a relative displacement of the two external surfaces. Thereby slits may be set into the external surfaces that will overlap in use. As a result, tight covering is achieved particularly as regards thermal radiation. The convective heat transfer of the interrupted surface improves the adaptation of the canopy temperature to the ambient one.

The support fabric keeps the two external sheets a specific distance apart, creating a center space. This center space serves especially to form a convective self-regulating air layer also insulating against heat radiation. If illustratively the temperature gradient rises at one external surface, then little heat transfer or none at all takes place to the other external surface. Obviously the heat conduction also depends on the material and the cross-section or length of the support fabric. Accordingly the support fabric or the spacers preferably consist of small-diameter, mutually crossing filaments. Thereby the heat conduction of this support fabric is kept negligibly small.

Furthermore the support fabric can be provided with a coating of a substance containing carbon-black pigments or magnetic pigments. This coating also improves the absorption of hf electromagnetic waves. Illustratively this coating may be applied by impregnation, in which case the external textile sheets are impregnated in corresponding manner as well.

In order to form a constant, insulating air layer, the center space between the two external textile surfaces may be sealed to be air- and water-tight. In such a case it was found advantageous to seal the canopy edge with a suitable tape. In this embodiment it is especially feasible to make the center space communicate with a coolant source, so that the center space may be flushed, for example, with cooling air.

This step too serves to screen thermal radiation and/or to alter the object contour in the thermal range.

In order to further convectively match the ambient temperature, the macroscopic surface shall be advantageously enlarged. This effect is achieved by embossing or by weaving yarns or monofilaments evincing different thermal shrinkage. Because of the heat involved when applying the above described coating, partial shrinkage of the threads, yarns or monofilaments results in crimping of the surface. Another step to increase thermal background matching by convection is to have grid-like surfaces.

Preferably the external textile surfaces consist of nonflammable fibers or monofilaments which are preferably self-extinguishing. Moreover the textiles can be flame-proofed correspondingly by suitable incorporation of additives to the coatings.

This canopy of the invention provides a shield-like structure evincing a highly advantageous effect regarding thermal radiation or hf electromagnetic microwaves. It can be folded and/or rolled up and its effectiveness is not degraded by kinking.

BRIEF DESCRIPTION OF THE DRAWINGS

Further advantages, features and particulars of the invention are elucidated below in the description of preferred embodiments and the attached drawings wherein.

DETAILED DESCRIPTION OF THE PREFERRED EMBODIMENTS

Figure 1:
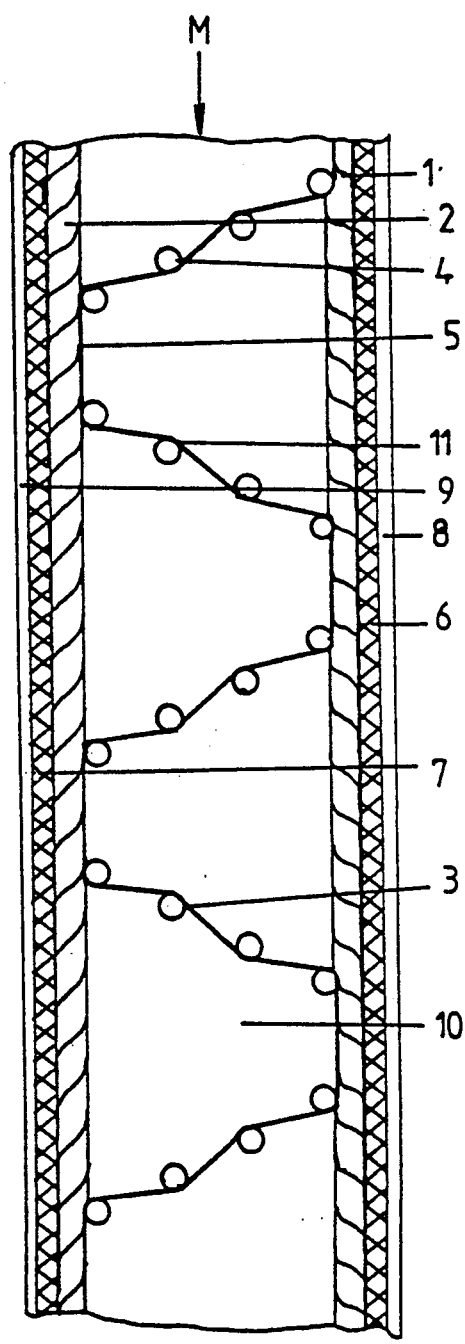
FIG. 1 is a cross-section of a first embodiment of a canopy in accordance with the invention.

FIG. 1 shows a canopy M with two woven external sheets of material 1 and 2 which sandwich a support fabric 3 made of yarns 4 and 5 crossing one another in net-like manner. This support fabric 3 assures that a space 10 is preserved between the external sheets 1 and 2. In this context, the term "canopy" is used to mean any covering which can be placed or suspended over an object including such articles as tarpaulins and the like.

Both external sheets 1 and 2 furthermore are covered by layers of synthetic resin 6 and 7 to restrict water absorption by the canopy M. In turn, these layers of synthetic resin 6 and 7 are coated with a non-emitting color-film 8 and 9 in order to provide the customary optical appearance of the overall canopy M.

The center space 10 formed between the external sheets 1 and 2 and secured by the support fabric 3 serves as an insulating air layer which self-regulates the air convection when the temperature gradient of external sheet 1 changes relative to that of external sheet 2.

Heat conduction between the two external sheets 1 and 2 is substantially limited to conduction through yarns 4 and 5 of support fabric 3. This heat conduction is determined by the material used for yarns 4 and 5 of which the cross-section and the lengths are small and hence said conduction is negligibly small.

Figure 3:
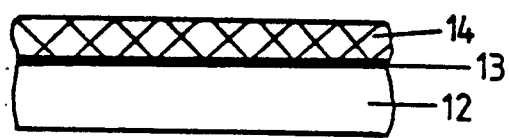
FIG. 3 is an enlarged partial, longitudinal section of an electrically conducting filament of the invention.
Figure 4:
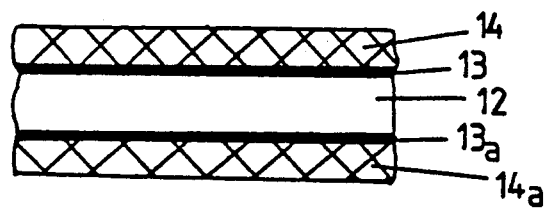
FIG. 4 is an enlarged, partial longitudinal section of a flexible, electrical conductor.

Moreover, the support fabric 3 can be impregnated with a film 11 containing carbon pigments and/or magnetic pigments. Another effective step is to outfit yarns or filaments 4 or 5 of the support fabric 3 in part or in whole with electrically conducting fibers, yarns or wires. As shown by FIGS. 3 and 4, yarns cut from coated sheets have been found especially effective and adaptable. As shown by FIG. 3, a conducting metal film 13 is laminated onto a base sheet 12 or illustratively is evaporated on it in vacuum. An electrically conductive coating 14 is then deposited as a protective layer.

FIG. 4 shows a further embodiment of a filament 4 or 5, in which the base sheet 12 is coated on both sides with metal films 13 and 13a and with co-conducting layers 14 and 14a resp. "Co-conducting" means that layers 14 and 14a conduct together with layers 13 and 13a. Both complement each other and avert defect sites.

This embodiment assures that suitable contacts are formed at the crossing points of the textile when it is being woven. The filaments 4 and 5 may be cut from the coated base sheets shown in FIGS. 3 and 4.

To achieve absorption of hf waves, both synthetic resin layers 6 and 7 are preferably pigmented with carbon up to a desired electrical conductivity. Moreover all electrically conducting layers of the invention also may be enriched with magnetically effective iron oxide granules.

Figure 2:
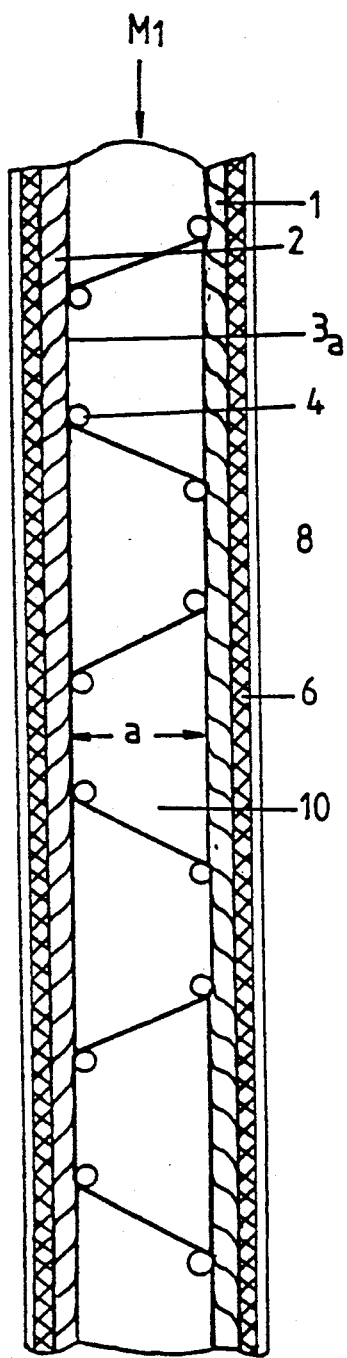
FIG. 2 is a cross-section of another embodiment of a canopy in accordance with the invention with mutually displaceable external surfaces.

Whereas the canopy M of FIG. 1 is comparatively hard and inflexible, FIG. 2 shows a softer and more easily handled design wherein the support fabric 3 lacks absorption of its own in the center space 10 between the external surfaces 1 and 2 and is plainly connected to them. Otherwise the stratification of this canopy $M_1$ corresponds to that of FIG. 1. The support fabric 3a has been reduced to the bare minimum to preserve its essential function, and only cross-filaments 4 being provided which support the external surfaces 1 and 2. No further reinforcing cross-filaments such as shown in FIG. 1 are provided.

By means of this design, the two external surfaces 1 and 2 are allowed to be relatively displaceable. Moreover the effect already described above of blocking thermal radiation is achieved when the two surfaces are cut into to give them structure.

What is claimed is:

1. A canopy to obscure an object by reflecting its thermally emitted waves and absorbing high-frequency (hf) electromagnetic waves in the microwave range, especially radar waves, comprising first and second external textile sheets (1,2), said sheets being grid-like to enhance convective heat adaptation;

means for interconnecting said sheets to each other including a support fabric (13) of woven material woven together with said first and second external sheets, forming and maintaining a central space (10) for air convection between said sheets; and a coating on at least one external surface of said sheets which reflects incident energy in the thermal range and absorbs incident electromagnetic energy in the microwave range.

2. A canopy according to claim 1 wherein said first and second external textile sheets include fillings or warps of filaments, yarns or monofilaments of different thermal shrinkages.

3. A canopy according to claim 1 wherein each of said textile sheets includes electrically conducting filaments woven into said textile sheets.

4. A canopy according to claim 3, wherein said electrically conducting filaments comprise an electrically conducting layer (14) formed on a base sheet (12).

5. A canopy according to claim 4 wherein said conducting layer is deposited layer of metal (13).

6. A canopy according to claim 3 wherein said filaments comprise a base sheet (12) coated on both sides with an electrically conducting layer (14, 14a).

7. A canopy according to claim 6 wherein said conducting layer is deposited layer of metal (13, 13a).

8. A canopy according to claim 3, wherein said filaments (4, 5) form the support fabric (3) of the two external sheets (1, 2).

9. A canopy according to claim 8 wherein said support fabric (3) consists of mutually crossing filaments (4, 5).

10. A canopy according to claim 9 wherein said support fabric (3) comprises a coating (11) containing one of carbon pigments or magnetic pigments.

11. A canopy according to claim 8, wherein said coating (11) was prepared by impregnation, the external sheets (1, 2) having been impregnated.

12. A canopy according to claim 6 wherein the edges of the canopy (M, M₁) are sealed by a tape.

13. A canopy according to claim 6 and including a coolant source connected to said center space (10).

14. A canopy to obscure an object by reflecting its thermally emitted waves and absorbing high-frequency (hf) electromagnetic waves in the microwave range, especially radar waves, comprising first and second external textile sheets (1,2);

means for interconnecting said sheets to each other including a support fabric (13) of woven material woven together with said first and second external sheets, forming and maintaining a central space (10) for air convection between said sheets; and a coating including a layer (6, 7) pigmented with carbon on at least one external surface of said sheets which reflects incident energy in the thermal range and absorbs incident electromagnetic energy in the microwave range.

15. A canopy according to claim 14, wherein said layer includes magnetic powders.

16. A canopy according to claim 15, wherein said layer (6, 7) is enriched with magnetic, spherical iron oxide granules.

17. A canopy according to claim 15, wherein said layer (6, 7) is water impermeable.

18. A canopy according to claim 17, wherein said layer (6,7) includes a base material of a synthetic resin.

19. A canopy according to claim 17, characterized in that the layer (6, 7) is colored.

20. A canopy according to claim 17 wherein said layer (6, 7) includes a non-emitting color-film (8, 9) deposited on an external surface of said layer.

* * * * *